United States Patent
Puchner et al.

(10) Patent No.: US 8,063,655 B2
(45) Date of Patent: Nov. 22, 2011

(54) METHOD AND CIRCUIT FOR REDUCING DEGRADATION IN A REGULATED CIRCUIT

(75) Inventors: Helmut Puchner, Santa Clara, CA (US); Oliver Pohland, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 157 days.

(21) Appl. No.: 11/483,686

(22) Filed: Jul. 10, 2006

(65) Prior Publication Data
US 2007/0018678 A1    Jan. 25, 2007

Related U.S. Application Data

(60) Provisional application No. 60/700,587, filed on Jul. 19, 2005, provisional application No. 60/708,743, filed on Aug. 16, 2005.

(51) Int. Cl.
*G01R 31/02* (2006.01)
(52) U.S. Cl. .............................. 324/762.09; 324/762.01
(58) Field of Classification Search .......... 324/754–769, 324/158.1; 716/4; 438/216
See application file for complete search history.

(56) References Cited

U.S. PATENT DOCUMENTS

| | | | |
|---|---|---|---|
| 5,229,311 A | 7/1993 | Lai et al. | |
| 6,071,784 A | 6/2000 | Mehta et al. | |
| 6,144,214 A * | 11/2000 | Athan | 324/763 |
| 6,455,901 B2 * | 9/2002 | Kameyama et al. | 257/371 |
| 6,456,104 B1 * | 9/2002 | Guarin et al. | 324/769 |
| 6,521,469 B1 * | 2/2003 | La Rosa et al. | 438/17 |
| 6,762,961 B2 | 7/2004 | Eleyan et al. | |
| 6,774,462 B2 | 8/2004 | Tanaka et al. | |
| 6,815,970 B2 * | 11/2004 | Rost et al. | 324/765 |
| 6,879,177 B1 * | 4/2005 | Bolam et al. | 324/765 |
| 6,885,105 B2 | 4/2005 | Kakamu et al. | |
| 6,933,869 B1 * | 8/2005 | Starr et al. | 341/120 |
| 7,163,886 B2 | 1/2007 | Fujiwara et al. | |
| 7,176,522 B2 | 2/2007 | Cheng et al. | |
| 7,256,087 B1 * | 8/2007 | Sadoughi et al. | 438/216 |
| 7,268,575 B1 * | 9/2007 | Chen et al. | 324/769 |
| 2005/0012122 A1 | 1/2005 | Kakamu et al. | |
| 2006/0267621 A1 * | 11/2006 | Harris et al. | 324/765 |

OTHER PUBLICATIONS

USPTO Notice of Allowance for U.S. Appl. No. 11/018,422 dated Apr. 16, 2007; 7 pages.
USPTO Non-Final Rejection for U.S. Appl. No. 11/018,422 dated Dec. 1, 2006; 9 pages.
USPTO Non-Final Rejection for U.S. Appl. No. 11/018,422 dated Jul. 21, 2006; 12 pages.
USPTO Requirement Restriction for U.S. Appl. No. 11/018,422 dated May 8, 2006; 5 pages.

* cited by examiner

*Primary Examiner* — Huy Q Phan
*Assistant Examiner* — Arleen M Vazquez (57) ABSTRACT

A regulated circuit having a number of metal-oxide-semiconductor field effect transistors (MOS FETs) and a method for using the same are provided to reduce Negative Bias Temperature Instability degradation of the MOS FETs on the circuit. In one embodiment, the method involves steps of: (i) detecting degradation in performance of at least one of the MOS FETs causing a shift in threshold voltage ($V_T$) of the MOS FET; and (ii) if the shift in $V_T$ exceeds a predetermined value, forward biasing the MOS FETs, thereby reducing or reversing the shift in $V_T$. Optionally, the method includes an initial step of determining if the circuit is in a non-dynamic operating mode before forward biasing the MOS FETs. Other embodiments are also disclosed.

14 Claims, 6 Drawing Sheets

METHOD AND CIRCUIT FOR REDUCING DEGRADATION IN A REGULATED CIRCUIT

CROSS-REFERENCE TO RELATED APPLICATIONS

The present application claims the benefit of priority under 35 U.S.C. 119(e) to U.S. Provisional Patent Application Ser. No. 60/700,587, filed Jul. 19, 2005 entitled A Method and Circuit for Reducing Degradation in a Regulated Circuit; and to U.S. Provisional Patent Application Ser. No. 60/708,743, filed Aug. 16, 5005, entitled A Body Bias Regulator for Reducing Degradation in a Regulated Circuit; both of which applications are hereby incorporated by reference.

TECHNICAL FIELD

This invention pertains generally to methods and circuits for reducing degradation in a regulated circuit, and more particularly to a regulated circuit having a body bias regulator or circuit and a method for using the same to reduce Negative Bias Temperature Instability degradation of metal-oxide-semiconductor field effect transistors in the circuit.

BACKGROUND OF THE INVENTION

P-channel Metal Oxide Semiconductor (PMOS) Field Effect Transistors (FETs) with p+ doped polysilicon gates and Nitrided Gate Oxides (NGOX) have been found to exhibit Negative Bias Temperature Instability (NBTI) after voltage and/or temperature aging. This instability gives rise to the problems that under negative gate bias voltage, the magnitude of threshold voltage ($V_T$) of the FET increases and drain saturation current ($I_{DS}$) decreases. This mechanism is known to cause degradation of performance of the PMOS FETs over time.

Prior technologies using single doped polysilicon gates and pure silicon dioxide ($SiO_2$) gate oxides do not exhibit a NBTI problem. Thus, causes of and problems resulting from NBTI have not, up to now, been fully recognized or techniques to solve the problem been developed.

Figure 1A:
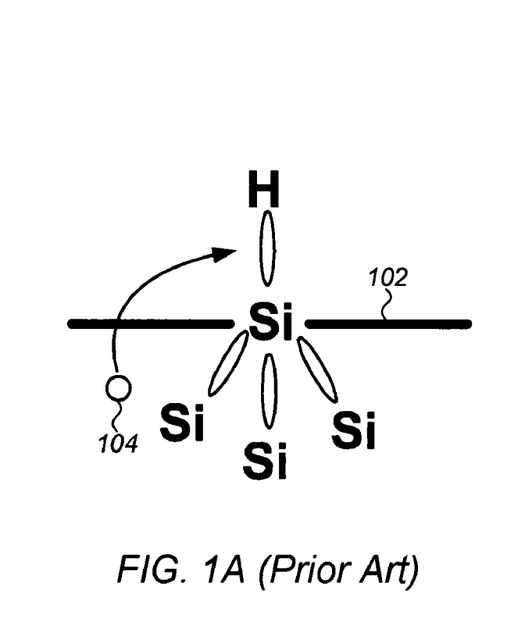
FIGS. 1A to 1C (Prior Art) illustrate a mechanism giving rise to Negative Bias Temperature Instability (NBTI)
Figure 1B:
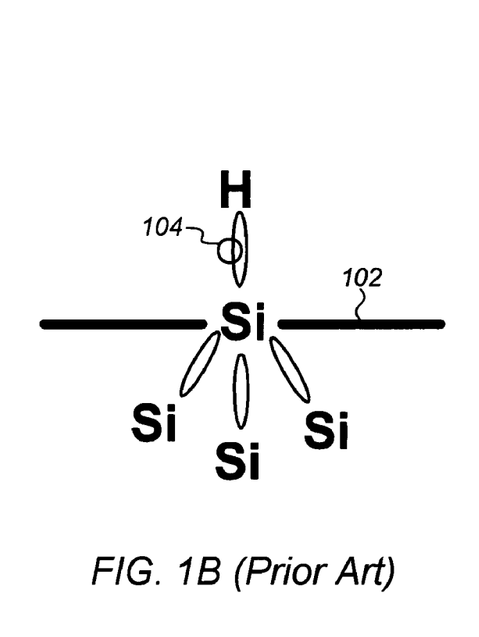
Figure 1C:
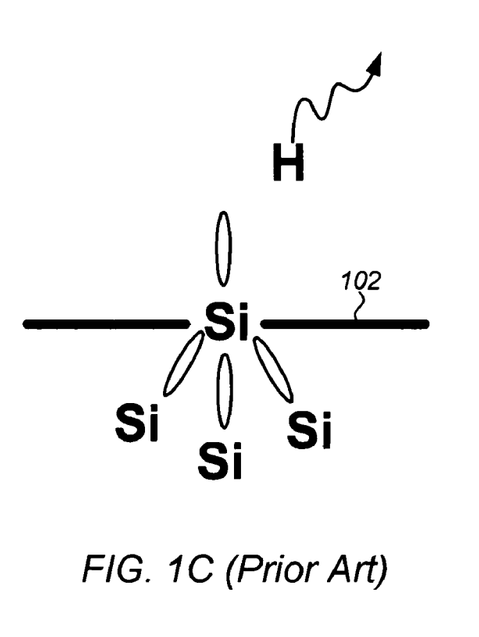

One mechanism proposed in the literature as giving rise to the NBTI problem, is illustrated in FIGS. 1A to 1C. Briefly, interface traps ($N_{IT}$) are generated at the NGOX interface 102 by hole-assisted rupture of Si—H bonds by a free holes 104. The holes 104 can be either supplied by a channel charge during operation of the PMOS FETs or by tunneling through the NGOX. FIG. 1A illustrates hole-tunneling by a hole 104 through the NGOX interface 102. FIG. 1B illustrates hole-capture of the hole 104 by the Si—H bond at the NGOX interface 102. FIG. 1C illustrates a broken Si—H bond resulting from the hole-capture shown in FIG. 1B.

The reaction pathways illustrated in FIGS. 1A to 1C may be summarized by the following equations:

$Si-H+h=Si^{+}+H^{0}, H^{0}+H^{0}=H_{2}$; and $Si-H+h+H^{0}=Si^{+}+H_{2}$.

where Si—H is the unbroken silicon-hydrogen bond, h is a free hole, $Si^{+}$ is a silicon ion created by the breaking of the silicon-hydrogen bond, $H^{0}$ is a hydrogen ion or atomic hydrogen created by the breaking of the silicon-hydrogen bond, and $H_{2}$ is gaseous hydrogen formed and released by the ongoing reaction.

It will be appreciated that $N_{IT}$ generation is proportional to the hole density, and as $N_{IT}$ increases so does the tunneling probability and capture cross section.

The result of the above described reaction is the degradation of the PMOS transistor due to positive interface charge associated with broken Si—H bonds. The degradation is temperature, bias and process dependent. Moreover, the degradation caused by NBTI increases with the strength of the electric field applied across the NGOX. Thus, the NBTI problem becomes worse with each successive generation of PMOS FETs as the gate oxide thickness is aggressively reduced. In addition the incorporation of Nitrogen at the gate oxide interface to lower the susceptibility against boron penetration has deteriorated the gate oxide interface quality and hence amplified the NBTI related transistor degradation.

Heretofore efforts at addressing the NBTI problem have focused on processing techniques to getter or isolate hydrogen and water from the gate oxide layer. This approach has not proven wholly satisfactory for a number of reasons, including: (i) the cost associated with additional process steps; (ii) the incompatibility of the gettering and barrier materials with existing processes; and (iii) the limited effectiveness of these materials.

Accordingly, there is a need for a design solution or a regulator and method of operating the same to significantly reduce NBTI degradation in regulated circuits. It is further desirable that the regulator and method work to mitigate or reduce degradation in regulated circuits arising from causes other than NBTI.

The present invention provides a solution to these and other problems, and offers further advantages over conventional complementary (CMOS) circuits.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to methods and circuits for reducing degradation in performance of a regulated circuit, and more particularly, to methods and circuits for improving or reducing Negative Bias Temperature Instability (NBTI) degradation.

The methods and circuits of the present invention is particularly useful for static random access memories (SRAM)

as well as specialty memory parts in which P-channel Metal Oxide Semiconductor (PMOS) Field Effect Transistors (FETs) are exposed to significant NBTI degradation.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The terms "to couple" and "to electrically couple" as used herein may include both to directly connect and to indirectly connect through one or more intervening components.

Methods and circuits for reducing degradation in a regulated circuit according to various embodiments of the present invention will now be described in greater detail with reference to FIGS. 2 through 6. For purposes of clarity, many of the details of circuits using regulators, regulators and methods of operating the same that are widely known and are not relevant to the present invention have been omitted from the following description.

It has been discovered that: (i) NBTI degradation can recover if the equilibrium between generated and recombined interface charge is modified; and (ii) the balance between released hydrogen at the gate oxide interface and recombined hydrogen determines the net generation rate of charges. Moreover, the electrical field applied across the gate oxide determines the generation rate of the charges. Thus, if the electric field from the Vcc is lowered the equilibrium is reached within a very short time period, and there is recovery occurring during the time of the lower Vcc. Accordingly, the new regulator design and method includes a temporary Vcc power down cycle in which NBTI degradation is partially if not completely recovered or reversed.

Briefly, in one aspect the process or method of the present invention involves assessing NBTI degradation when the regulated circuit is in a standby or a non-dynamic operating mode, and lowering the regulator output voltage when a predetermined degradation threshold has been met. By a non-dynamic operating mode it is meant an idle cycle of the regulated circuit when I/Os and/or data are not accessed.

Figure 2:
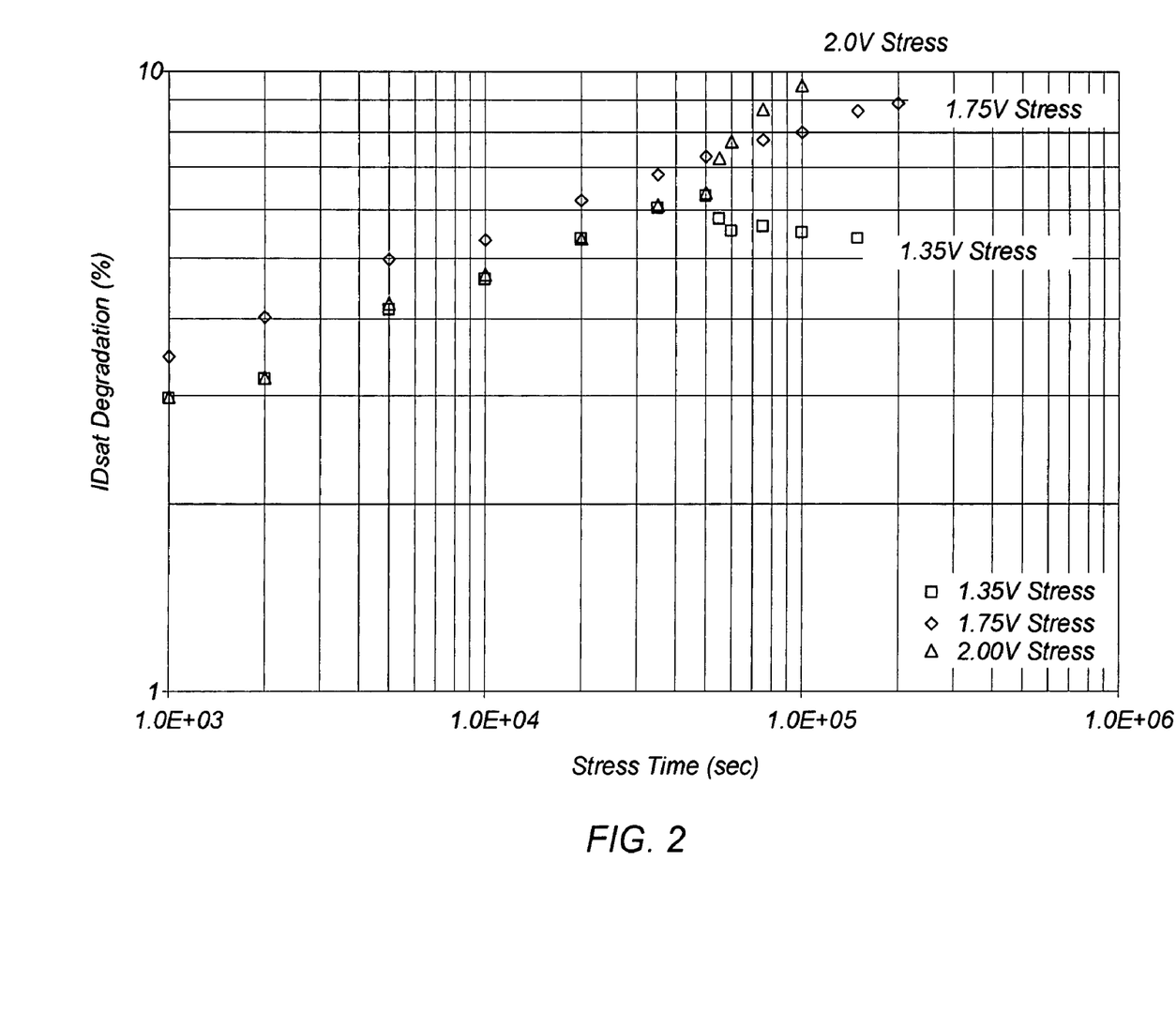
FIG. 2 are graphs showing percent shifts or degradation in a drain saturation current ($I_{Dsat}$) caused by NBTI over time for different levels of applied gate voltage ($V_g$) for metal-oxide-semiconductor field effect transistors (MOS FETs) having a regulator circuit and operated according to embodiments of the present invention.

FIG. 2 shows graphs exhibiting shifts in a percent of drain saturation current ($I_{Dsat}$) degradation caused by NBTI over time for different levels of applied gate voltage ($V_g$) according to embodiment of the present invention. Referring to FIG. 2 it is seen that maintaining the voltage stress applied to a gate oxide of the PMOS FET at, for example, 1.75V over time, or increasing the stress to, for example, 2.0V, leads to greater degradation in $ID_{SAT}$, and therefore a downward shift or decrease in threshold voltage ($V_T$), over time. However, reducing the applied voltage, for example to 1.35V, reduces the degradation in $ID_{SAT}$ and in $V_T$. In the embodiment graphically illustrated by the square blocks in FIG. 2 the degradation is allowed increase to a threshold value of about 6.5% above a nominal $ID_{SAT}$ at which time (about 5.0E+04 seconds), the applied voltage is reduced to about 1.35V in accordance with the method of the present invention, and the degradation in $ID_{SAT}$ begins to drop relatively quickly to about 5.5%.

Figure 3:
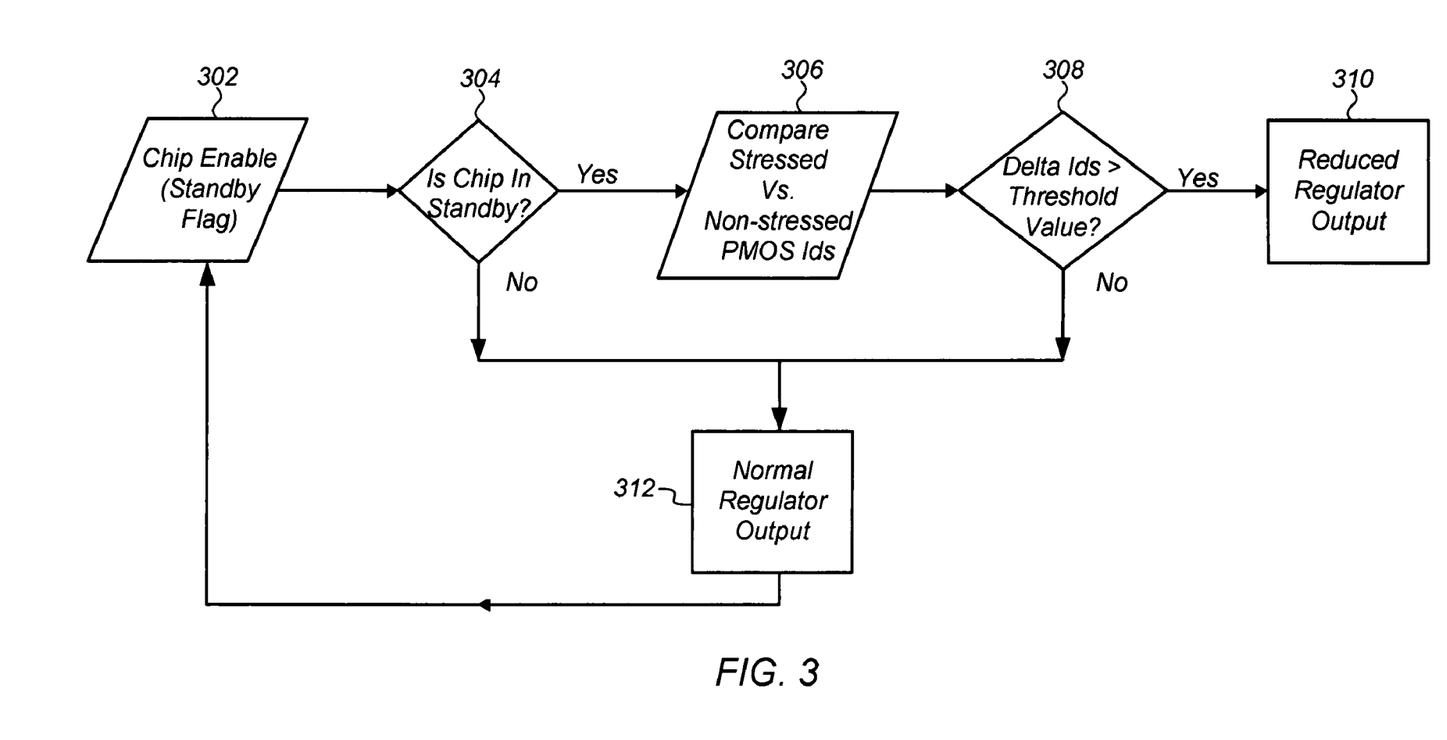
FIG. 3 is a flowchart of a method for assessing and reducing NBTI degradation according to an embodiment of the present invention.

Referring to FIG. 3, the method involves steps of: (i) setting a chip enable or a standby flag for the regulated circuit (step 302); (ii) determining if the regulated circuit or chip is in standby or a non-dynamic operating mode (step 304); (iii) detecting degradation in performance of at least one of the MOS FETs causing a shift in threshold voltage ($V_T$) of the MOS FET, for example by comparing a stressed versus non-stressed $ID_{SAT}$ for a PMOS FET (step 306); (iv) determining if a delta or shift in $V_T$ of the MOS FET exceeds a predetermined threshold value (step 308); and (v) if the shift in $V_T$ exceeds the predetermined value, reducing a voltage (Vcc) applied by a voltage regulator across gate dielectrics of the MOS FETs, step 310, thereby reducing or reversing the shift in $V_T$. If the regulated circuit or chip is not in standby, or if the shift in $V_T$, evidenced by a change in $ID_{SAT}$, is less than the predetermined value a normal voltage regulator output (Vcc) is maintained (step 312).

Generally, the MOS FETs include a number of PMOS FETs having p+ doped polysilicon gates and Nitrided Gate Oxides (NGOX), and the step of detecting degradation in performance includes the step of detecting a shift or delta in $V_T$ of at least one of the plurality of PMOS FETs caused by NBTI by detecting a decrease in drain saturation current ($ID_{SAT}$) of the at least one of the PMOS FETs. The decrease in $ID_{SAT}$ can be detected, for example, by comparing the $ID_{SAT}$ of a stressed PMOS FET having an electric field across the NGOX thereof caused by charge generated by NBTI across the NGOX and the $ID_{SAT}$ of a non-stressed PMOS FET. By a stressed PMOS FET it is meant a PMOS FET having an electric field across the NGOX thereof caused by charge generated by NBTI across the NGOX. As noted above, the charge arises from the generation and recombination of hydrogen along the gate oxide interface.

The change or delta in is then compared to a predetermined threshold value, and, if the change exceeds the threshold, the voltage regulator output is reduced by a predetermined amount or to a predetermined lowered Vcc ($Vcc_{lowered}$). Generally, Vcc is lowered from about 100 to about 200 millivolts.

Preferably, where the regulated circuit is a memory circuit Vcc is reduced to a specified minimum value of Vcc ($Vcc_{MIN}$) for the memory circuit.

More preferably, where the regulated circuit is or includes an SRAM the step of reducing Vcc involves reducing Vcc to a data retention voltage for the SRAM.

In another aspect the present invention is directed to a method of reducing degradation of performance of an MOS FET or a rate at which degradation occurs by powering down the voltage regulator or reducing Vcc to a predetermined $Vcc_{lowered}$, after a predetermined number of clock cycles or during the idle time of a regulated part, when I/O and data are not accessed.

It will be appreciated that this approach is also useful in extending an operating lifetime of the MOS FETs by extending a time to dielectric breakdown (TDB), at which performance is degraded beyond a specified amount, is extended. By dielectric breakdown is meant the breakdown of the gate dielectric caused by holes tunneling through the gate dielectric that cause $I_{GATE}$ to increase over time. Preferably, the Vcc is maintained at $Vcc_{lowered}$ whenever the circuit is in a non-dynamic operating mode and for substantially the entire time the circuit is in a non-dynamic operating.

It will further be appreciated that in either of the above described aspects or embodiments the circuitry to control the voltage regulator can be implemented by separate logic circuitry not integrally formed with the voltage regulator or the regulated circuit.

In yet another aspect or embodiment the present invention is directed to a circuit having a body bias regulator and a method for using the same to reduce or improve NBTI degradation. A method and a body bias regulator for reducing degradation in a regulated circuit according to this embodiment will now be described in greater detail with reference to FIGS. 4 and 5.

PMOS type transistors in complimentary metal-oxide-semiconductor (CMOS) integrated circuits generally formed within N-wells in a p-type substrate. In order to use body biasing to reduce or improve NBTI degradation the regulated circuit further includes a separate body contact or contacts for N-wells surrounding the affected PMOS FETs. Briefly, the process or method of this embodiment involves assessing NBTI degradation when the regulated circuit is in a standby or a non-dynamic operating mode, and temporarily forward biasing the MOS FETs when a predetermined degradation threshold has been met. Forward biasing changes the electric field across the gate oxide changing the net generation rate of charges and enabling recovery during forward biasing. Forward biasing also increases the drive current, which compensates the NBTI related drive current loss.

Figure 4:
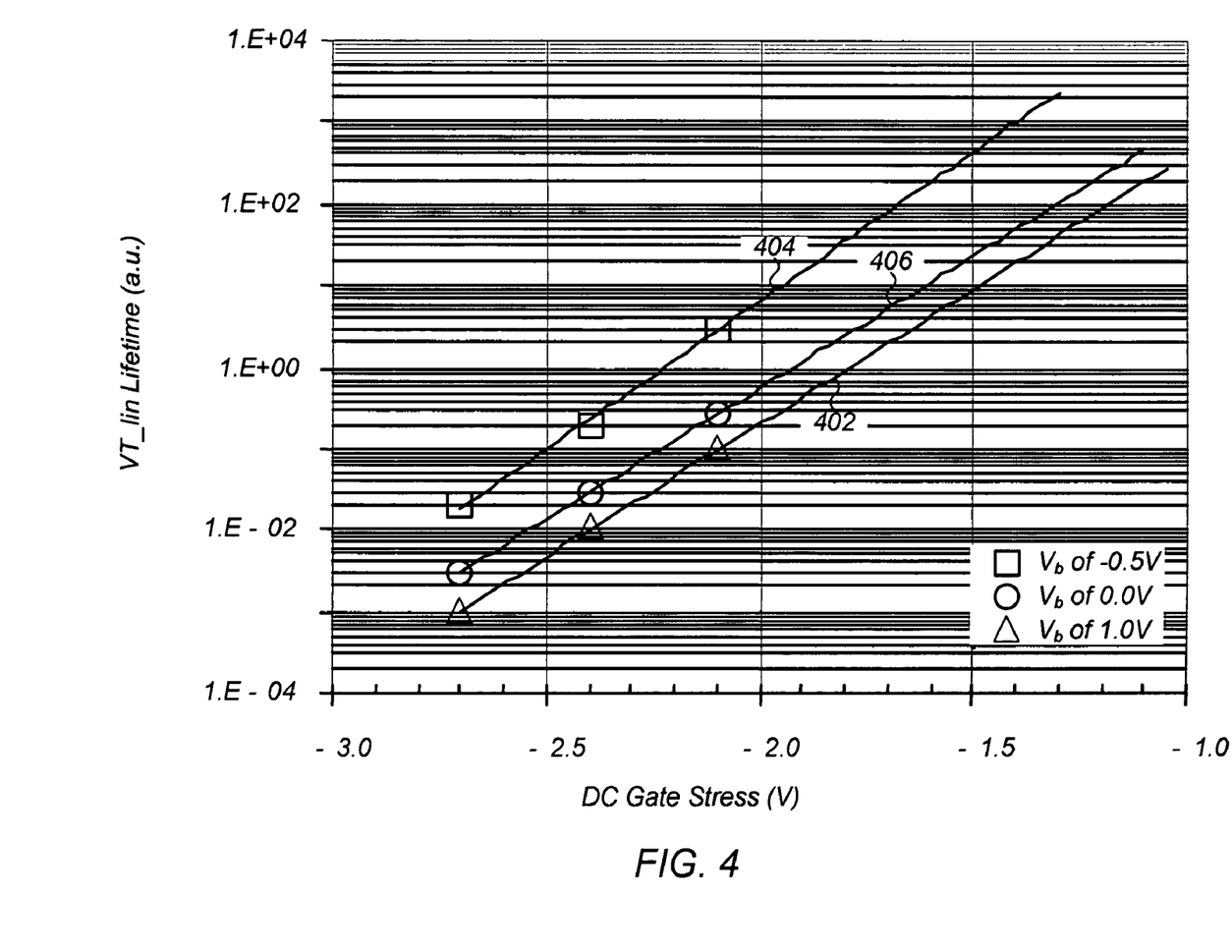
FIG. 4 are graphs showing improvement in NBTI lifetime as indicated by shifts in a linear threshold voltage ($V_T$) provided by different levels of applied body biasing voltage ($V_b$) according to embodiment of the present invention.

FIG. 4 shows graphs exhibiting improvement in NBTI lifetime as indicated by shifts in linear threshold voltage ($V_T$) provided by different levels of applied body biasing voltage ($V_b$). Referring to FIG. 4 it is seen that as the body bias voltage applied to the body contact for N-wells surrounding the PMOS FETs shifts from a normal body bias of about 1.0V, indicated by line 402 to a forward bias of about −0.5V, indicated by line 404, NBTI lifetime increases by a factor of about 20 as DC Gate Stress is reduced from about −2.7V to −1.5 V. In particular, as shown in FIG. 4 applying a $V_b$ of 0V, indicated by line 406, causes the NBTI Lifetime ($V_T$ Linear Lifetime) at a DC Gate stress of −1.5V to increase from a lifetime of about 3.0E−03 to about 2.0E+01. In the embodiment illustrated in FIG. 4, the $V_b$ is further increased to a value of about −0.5V, line 404, at which forward bias NBTI lifetime quickly increases to a lifetime of about 4.0E+02 at a DC Gate stress of −1.5V.

Figure 5:
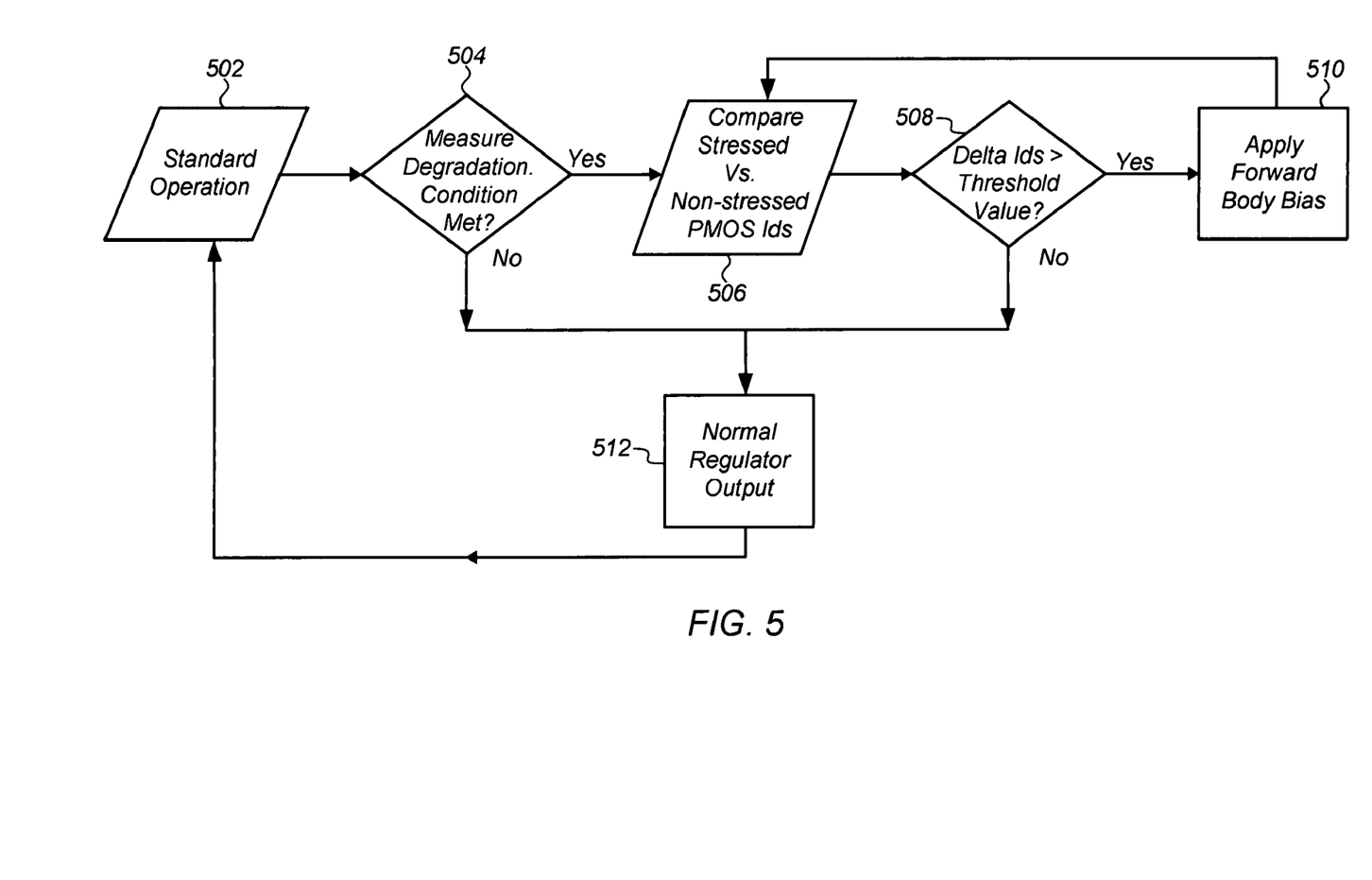
FIG. 5 is a flowchart of a method for assessing and reducing NBTI degradation according to another embodiment of the present invention.

A method for assessing and reducing NBTI degradation using forward biasing according to an embodiment of the present invention will now be described with reference to the flowchart of FIG. 5. Generally, the method presented can be applied in a dynamic as well as a non-dynamic circuit and is not limited to reaching a stand-by operation condition. The method begins with: (i) maintaining the circuit in a standard operating condition (step 502); (ii) degradation in performance of MOS FETs is measured to determine or detect if a degradation in performance of at least one of the MOS FETs is causing a shift in threshold voltage ($V_T$) of the MOS FET (step 504); (iii) the $ID_{SAT}$ of the stressed MOS FET is compared to a $ID_{SAT}$ for a non-stressed MOS FET (step 506); (iv) if the delta or shift in $V_T$ exceeds a predetermined value, step 508, the MOS FET is temporarily forward biased, (step 510), thereby reducing or reversing the shift in $V_T$. Optionally, after a predetermined number of cycles the $ID_{SAT}$ of the stressed MOS FET may be again compared to that of a non-stressed MOS FET, step 506, and steps 508 and 510 repeated as needed or desired. If the regulated circuit or chip is not in standby, or if the shift in $V_T$ evidenced by the change in $ID_{SAT}$ is less than a predetermined value, a normal body bias ($V_B$) is maintained (step 512).

In another embodiment of the current invention an uncontrolled predetermined amount of forward body bias can be applied globally to all PMOSFET transistors for the whole operating life of the circuit to compensate for the degradation which will occur during the use of the circuit over its life span.

The advantages of the method and design of at least some of the embodiments of the present invention over previous or conventional approaches include: (i) the ability to reduce the effect of degradation of MOS FET performance on a regulated circuit by reducing degradation of the MOS FETs—particularly NBTI degradation; (ii) it is a design solution to reduce the effect of NBTI degradation, which is compatible with and independent of all fabrication technologies and all product types (SRAM, DRAM, Logic, etc.); (iii) extending an operating lifetime of the MOS FETs by extending TDB; (iv) improving efficiency and reducing power consumption of regulated circuits by temporarily powering down or reducing Vcc when the circuit is in standby or a non-dynamic operating mode; and (v) improving circuits by temporarily forward biasing circuits and hence eliminating the need for design margins associated with NBTI degradation. This allows designing circuits with smaller margin and still guarantees full functionality across design corners.

Figure 6:
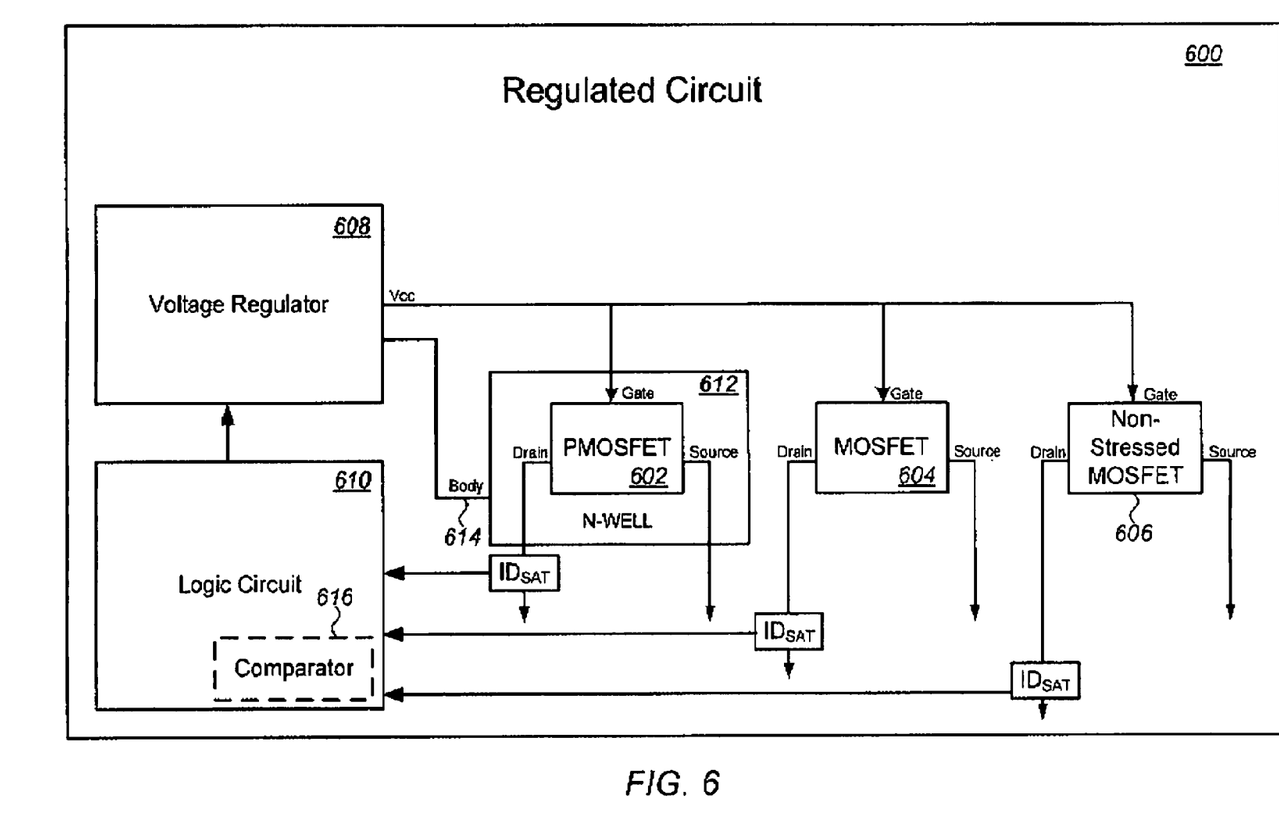
FIG. 6 is a block diagram of a regulated circuit according to one embodiment.

FIG. 6 is a block diagram of a regulated circuit according to one embodiment. The regulated circuit 600 includes: plurality of metal-oxide-semiconductor field effect transistors (MOS FETs 602, 604, 606); a voltage regulator 608 to apply a voltage (Vcc) across gate dielectrics of the plurality of MOS FETs; and a logic circuit 610 configured to detect degradation in performance of at least one of the plurality MOS FETs causing a shift in threshold voltage ($V_T$) of the MOS FET and to control the voltage regulator. The plurality of MOS FETs can include PMOS FETs 602 formed within N-wells 612 in a p-type substrate (not shown), and the regulated circuit 600 can further include a body contact 614 for N-wells surrounding the PMOS FETs. The logic circuit can include a comparator 616 to detect the degradation in performance by comparing a drain saturation current ($ID_{SAT}$) of a stressed PMOS FET 602, 604, having an electric field across the NGOX thereof caused by charge generated by NBTI to the $ID_{SAT}$ of a non-stressed PMOS FET 606.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of operating a regulated circuit including a plurality of metal-oxide-semiconductor field effect transistors (MOS FETs), the method comprising steps of:
    detecting degradation in performance of at least one of the plurality MOS FETs causing a shift in threshold voltage ($V_T$) of the at least one of the MOS FETs; and
    if the shift in $V_T$ exceeds a predetermined value, forward biasing the at least one of the plurality of MOS FETs for a predetermined number of clock cycles, whereby the shift in $V_T$ is reduced.

2. A method according to claim 1, wherein the plurality of MOS FETs include PMOS FETs formed within N-wells in a p-type substrate, and the regulated circuit further includes a body contact for N-wells surrounding the PMOS FETs, and wherein the step of forward biasing the at least one of the plurality of MOS FETs comprises the step of applying forward biasing between the body contact and gate electrodes of the PMOS FETs.

3. A method according to claim 1, wherein the plurality of MOS FETs include a plurality of PMOS FETs having p+ doped polysilicon gates and Nitrided Gate Oxides (NGOX), and wherein the step of detecting degradation in performance comprises the step of detecting a shift in $V_T$ of at least one of the plurality of PMOS FETs caused by Negative Bias Temperature Instability (NBTI).

4. A method according to claim 3, wherein the shift in $V_T$ caused by NBTI depends on an electric field across the NGOX, and wherein the step of forward biasing the at least one of the plurality of MOS FETs lowers the electric field across the NGOX, thereby lowering an equilibrium between a rate at which charge is generated by NBTI across the NGOX and a rate at which charge is recombined.

5. A method according to claim 4, wherein the step of detecting degradation in performance comprises the step of detecting a decrease in drain saturation current ($ID_{SAT}$) of the at least one of the plurality of PMOS FETs.

6. A method according to claim 5, wherein the step of detecting a decrease in $ID_{SAT}$ comprises the step of comparing the $ID_{SAT}$ of a stressed PMOS FET having an electric field across the NGOX thereof caused by charge generated by NBTI across the NGOX and the $ID_{SAT}$ of a non-stressed PMOS FET.

7. A method according to claim 1, wherein the circuit comprises any circuit capable of independent forward body bias control, and wherein the step of forward biasing the at least one of the plurality of MOS FETs comprises the step of forward body biasing the at least one of the plurality of MOS FETs to decrease degradation in $V_T$, thereby increasing a Negative Bias Temperature Instability (NBTI) lifetime of the at least one of the plurality of MOS FETs.

8. A method according to claim 1, wherein the circuit comprises a memory circuit, and further comprising a step of determining if the memory circuit is in an idle cycle before forward biasing the plurality of MOS FETs.

9. A method according to claim 8, wherein the biasing of the plurality of MOS FETs is controlled by a separate logic circuit, which forward biases the at least one of the MOS FETs after a predetermined number of clock cycles.

10. A regulated circuit comprising:
  a plurality of metal-oxide-semiconductor field effect transistors (MOS FETs);
  a voltage regulator to apply a voltage (Vcc) across gate dielectrics of the plurality of MOS FETs;
  a logic circuit to control the voltage regulator, the logic circuit to detect degradation in performance of at least one of the plurality MOS FETs causing a shift in threshold voltage ($V_T$) of the MOS FET; and
  wherein the plurality of MOS FETs are PMOS FETs formed within N-wells in a p-type substrate, and the regulated circuit further includes a body contact for N-wells surrounding the PMOS FETs, and wherein the logic circuit applies forward biasing between the body contact and gate electrodes of the PMOS FETs.

11. A regulated circuit according to claim 10, wherein the logic circuit forward biases the plurality of MOS FETs, if the shift in $V_T$ exceeds a predetermined value.

12. A regulated circuit according to claim 10, wherein the logic circuit reduces Vcc by a predetermined amount to a lowered Vcc ($Vcc_{lowered}$), if the shift in $V_T$ exceeds a predetermined value.

13. A regulated circuit according to claim 10, wherein the PMOS FETs comprise p+ doped polysilicon gates and Nitrided Gate Oxides (NGOX), and wherein the degradation of MOS FET performance arises from a shift in $V_T$ of at least one of the PMOS FETs caused by charge build up across the NGOX generated by NBTI Negative Bias Temperature Instability (NBTI).

14. A regulated circuit according to claim 13, wherein the logic circuit comprises a comparator to detect the degradation in performance by comparing a drain saturation current ($ID_{SAT}$) of a stressed PMOS FET having an electric field across the NGOX thereof caused by charge generated by NBTI to the $ID_{SAT}$ of a non-stressed PMOS FET.

* * * * *